United States Patent
Phan Le

(10) Patent No.: US 8,803,624 B2
(45) Date of Patent: Aug. 12, 2014

(54) MEMS RESONATOR

(75) Inventor: Kim Phan Le, Eindhoven (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/537,303

(22) Filed: Jun. 29, 2012

(65) Prior Publication Data

US 2013/0009716 A1  Jan. 10, 2013

(30) Foreign Application Priority Data

Jul. 6, 2011  (EP) ..................................... 11172918

(51) Int. Cl.
*H03B 5/30* (2006.01)

(52) U.S. Cl.
USPC ................... 331/154; 331/116 M; 73/504.12; 73/504.13; 73/504.14

(58) Field of Classification Search
USPC ............. 331/154, 116 M; 73/504.12, 504.13; 333/186, 199
See application file for complete search history.

(56) References Cited

U.S. PATENT DOCUMENTS

| | | |
|---|---|---|
| 5,025,346 A | 6/1991 | Tang et al. |
| 5,349,855 A | 9/1994 | Bernstein et al. |
| 5,869,760 A | 2/1999 | Geen |
| 5,889,207 A * | 3/1999 | Lutz ........................... 73/504.13 |
| 6,513,380 B2 * | 2/2003 | Reeds et al. ................ 73/504.12 |
| 6,952,965 B2 * | 10/2005 | Kang et al. .................. 73/504.12 |
| 2002/0020219 A1 * | 2/2002 | DeRoo et al. ............... 73/504.12 |
| 2002/0088279 A1 * | 7/2002 | Folkmer et al. ............. 73/504.08 |
| 2005/0081633 A1 | 4/2005 | Nasiri et al. |
| 2005/0174197 A1 | 8/2005 | Nguyen et al. |
| 2007/0070821 A1 | 3/2007 | Weigold |
| 2008/0284528 A1 | 11/2008 | Morita et al. |
| 2009/0167557 A1 | 7/2009 | Bubb et al. |
| 2009/0249873 A1 | 10/2009 | Delevoye |
| 2010/0026136 A1 | 2/2010 | Gaidarzhy et al. |
| 2010/0058861 A1 * | 3/2010 | Kuang et al. ................ 73/504.12 |

FOREIGN PATENT DOCUMENTS

WO  2010/044058 A1  4/2010

OTHER PUBLICATIONS

Gagnepain, J.J. "Nonlinear Properties of Quartz Crystal and Quartz Resonators: A Review" Proc. 35th Annual Frequency Control Symposium, USAERADCOM, pp. 14-30 (May 1981).
Zhang, W. et al. "Effect of Cubic Nonlinearity on Auto-Parametrically Amplified Resonant MEMS Mass Sensor", Sensors and Actuators A, vol. 102, pp. 139-150 (2002).
Extended European Search Report for European Patent Appln. No. 11172918.2 (Dec. 23, 2011).

* cited by examiner

*Primary Examiner* — Joseph Chang
*Assistant Examiner* — Jeffrey Shin

(57) ABSTRACT

A MEMS resonator has a resonator mass in the form of a closed ring anchored at points around the ring. A set of ring comb electrode arrangements is fixed to the ring at locations between the anchor points, to couple the input (drive) and output (sense) signals to/from the resonator mass.

11 Claims, 6 Drawing Sheets

MEMS RESONATOR

CROSS-REFERENCE TO RELATED APPLICATIONS

This application claims the priority under 35 U.S.C. §119 of European patent application no. 11172918.2, filed on Jul. 6, 2011, the contents of which are incorporated by reference herein.

This invention relates to MEMS resonators.

MEMS resonators are expected to replace bulky and expensive quartz crystals in high-precision oscillators. The oscillators are widely used in time-keeping and frequency reference applications such as real time clocks, RF modules in mobile phones, devices containing blue-tooth modules, USB modules, and other digital and telecommunication devices. MEMS oscillators offer small size, low cost and potentially high level of integration. Some first MEMS oscillator products have recently been commercialized.

A MEMS oscillator basically comprises a MEMS resonator and an external amplifier circuit. The two parts can reside in two separate dies in the same package, or can be integrated into the same die. The MEMS resonator consists of a silicon mass-spring system, which can be excited into mechanical resonant vibration, and means to sense this vibration and to convert it into an electrical signal. The electrical signal is fed into an amplifier circuit. This circuit basically consists of a gain amplifier and a phase shifter. The output of the amplifier is fed back into the actuation side of the resonator. If the total loop gain is larger than one and the loop phase shift is zero, the oscillation can be maintained within the loop. The output frequency of the oscillator is kept stable by the MEMS resonant frequency.

There are many kinds of MEMS resonators. The most three popular types of MEMS resonators are capacitive resonators, piezoelectric resonators, and piezoresistive resonators. From the applications point of view, there are two interesting frequency ranges: MHz and kHz. Oscillators that output signal in the MHz range (typically from 10 MHz up to a few hundred MHz) find applications in, for example, USB, Ethernet, video and audio circuits. Oscillators that operate in the kHz range (typically 32 kHz up to a few hundred kHz) can be used in Real-Time-Clock (RTC) circuits, low speed serial I/O, etc.

For the MHz range, piezoresistive resonators have the benefit of lower phase noise. At the kHz frequency range, since ultra-low power is often required (for instance for real time clocks), the capacitive principle is a better option.

In capacitive MEMS resonators, the resonant structure is actuated by an electrostatic force which acts over an actuation gap. The electrostatic actuation can be based on either the parallel-plate or comb-drive principle. To sense the vibration of the structure, a capacitance change between the structure and a fixed electrode, separated by a sensing gap (sometimes also by the same actuation gap) is used as output signal. To sense the capacitance change, a DC voltage is applied between the structure and the sensing electrode. The capacitance change manifests itself in the AC current that flows through the sensing gap, which is called the motional current.

To ensure a good performance, the resonator should deliver sufficient signal-to-noise ratio (SNR), which is proportional to the motional current Im:

$$I_m = \eta \frac{\partial x}{\partial t} = \eta \omega_0 x_0 \cos \omega_0 t \quad (1)$$

in which x and x0 are the displacement and the vibration amplitude, respectively; ω0 is the resonant frequency, t is time, and η is the electromechanical coupling coefficient, which depends on the DC bias voltage on the gap, gap size, the electrode area, etc.

As seen from (1), the motional current is proportional to the product of resonant frequency and vibration amplitude. Unfortunately, for low-frequency resonators, which are the main interest for this invention, Im can be quite small due to the small value of ω0.

However, it is possible to compensate for this by exciting the device with large amplitude x0. Moreover, the signal to noise ration (SNR) is also determined by the power handling of the resonator, which is the maximum energy stored in the system in every cycle. The storage energy is expressed by:

$$E_{max} = (1/2) k_{eff} x_0^2 \quad (2)$$

in which keff is the effective spring stiffness of the resonator. For low-frequency resonators, keff is often very small, thus Emax might be small as well. For low-frequency resonators it is very important to have large vibration amplitude.

For large vibration amplitude, parallel-plate actuation is not a good option since the small actuation gap limits the vibration amplitude and the actuation force is highly non-linear when the vibration amplitude is large. It is known to use comb-drive structures for linear actuation force and large vibration amplitude. A very popular low-frequency resonator design is the shuttle structure with comb-drives.

FIG. 1 shows such a shuttle resonator as disclosed in U.S. Pat. No. 5,025,346.

The resonator body consists of a small bar that connects two combs 10,12 shown on the left and right hand sides in FIG. 1. The body is held by four folded beams 14,16, i.e. they form a U shape, and the limbs can tilt to the left and right. These beams are anchored to a fixed substrate 18. The body of the resonator is free standing and can wobble to the left and right around the central rest position. In some cases (not shown), the beams can be straight beams that are clamped at two anchors. The number of beams can vary from 2, 4 to more than 4.

The combs have a plurality of interdigitated fingers. They are interleaved with electrodes which are fixed to the substrate and having an array of electrode fingers 19. The two fixed electrodes fixed are connected to the outside world as the input and the output ("IN" and "OUT" in FIG. 1).

In normal operation, a combination of a DC and AC voltage (Vdc and Vac) is applied at the input, with respect to the shuttle structure which is grounded at the anchors. This combination of voltages creates an AC force across the interdigitated fingers of the input electrode, which makes the shuttle vibrate. The AC force is proportional to the product of Vac and Vdc.

If the frequency of the voltage Vac, thus the actuation force, equals the natural frequency of the shuttle, resonance occurs and the shuttle is driven to the maximum amplitude. To sense the vibration, a DC voltage is applied between the output and the grounded structure. As a result of the capacitance change between the moving and fixed fingers at the output electrode, an AC motional current is present in the output circuit, which can be sensed by a readout circuit.

This design has basically two problems:

(i) Low Q factor: the Q factor is determined by mechanical energy loss during a vibration cycle. The lower the loss, the higher Q factor the resonator has. The design as shown in FIG. 1 has an asymmetric resonant mode shape, since at any position other than the rest position, the structure is not symmetric around the anchor points. This gives rise to large mechanical loss through the anchors, since during vibration, the shuttle body continuously makes asymmetric stress on the anchors.

Those skilled in the art will know that a good resonator design should have either symmetric resonant mode shape, or have anchors attached to nodal points of the resonant body. The nodal points are the points that do not (substantially) move during vibration.

(ii) Nonlinearity: resonators can be modelled as a mass-spring system. In the ideal case, the spring should be linear, which means its stiffness k is a constant regardless of the vibration amplitude. However, in reality, it is not often the case: the stiffness is a function of amplitude. There are three different sources of nonlinear spring stiffness: spring construction, material nonlinearity, and electrical nonlinearity derived from the actuation force (this is often the electrostatic force). The material nonlinearity is always present and there is little that can be done to avoid it, except for minimizing it by choosing the right crystal orientation. The comb-drive structure inherently offers quite linear force, compared to the parallel-plate actuation. The largest contribution to the nonlinearity in the shuttle resonator is the beam structure which couples the resonator to the anchor points. The recovery force of a folded beam can be modelled as polynomial function of displacement x:

$$F(x)=k_1 x+k_3 x^3; \quad (3)$$

in which $k_1$ and $k_3$ are the linear and cubic stiffness terms. For the folded beams, $k_3$ is positive, which implies that the spring becomes harder at large vibration amplitudes. Consequently at large amplitude, the resonant peak (of the amplitude-frequency response curve) is no longer symmetric.

A typical example of a nonlinear behaviour is shown in FIG. 2. This graph of admittance vs. frequency is a real response curve measured on a shuttle resonator having a resonant frequency of 35 kHz. The arrows show the direction of signal sweep during frequency sweep-up and frequency sweep-down.

The resonant peak at large amplitudes becomes tilted to higher frequency and there is a large jump around the resonance. If the frequency is swept up and down, there exists hysteresis between the sweep-up and sweep-down curves. This is a typical example of the cubic nonlinearity of the spring.

The nonlinearity of the resonator should be avoided in oscillators. It has been well known in the past for quartz-based oscillators that the nonlinear behaviour is the origin of almost all frequency instabilities, harmonic generation (which causes energy loss to the higher order harmonics), amplitude-frequency effect and intermodulation.

The nonlinearity of the shuttle resonators suppresses operation at large amplitude, while large amplitude is crucial in those low-frequency resonators to gain enough SNR.

According to the invention, there is provided a MEMS resonator comprising:

a resonator mass in the form of a closed ring;

a set of one or more anchor points spaced around the ring, where the ring is connected to a fixed substrate at the anchor points;

a set of ring comb electrode arrangements fixed to the ring;

at least one drive comb electrode arrangement attached to the substrate and which interfaces with one of the set of comb electrode arrangements fixed to the ring;

at least one sense comb electrode arrangement attached to the substrate and which interfaces with another one of the set of comb electrode arrangements fixed to the ring; and a control circuit for controlling the signals applied to the at least one drive comb electrode arrangement.

The invention provides a ring-shaped resonator body with comb-drives (for driving and for sensing) attached to the ring. This arrangement gives higher quality factor and better linearity. By "ring" is meant any closed shape, which can be a circle or any other polygon. It is not a solid shape, but rather comprises a beam which follows a closed path.

A ring shaped resonator does not shuttle from side to side, but deforms in shape. By suitable selection of the position around the ring at which the comb electrodes are fixed, and suitable design of the ring shape, the deformation of the shape can give rise to the required linear movement of the comb electrodes.

One or more anchors at are provided for example at quasi-nodal points to minimize the mechanical loss and to enhance the linearity. These quasi-nodal points are the points of minimum movement of the ring during resonant deformation of the ring. A prefect nodal point will be stationary, but such points may not exist. Reference to a nodal point in the description can claims should be understood as relating to the most positionally stable point of the resonator between the anchors, and thus includes a "quasi-nodal" point.

The structure of the invention offers far superior behaviour in terms of high quality factor and linearity to the shuttle resonators.

There can be a set of exactly four ring comb electrode arrangements, exactly two drive comb electrode arrangements and exactly two sense comb electrode arrangements. The four ring comb electrode arrangements can be evenly angularly spaced around the ring, and the two drive comb electrode arrangements are then diametrically opposite, and the two sense comb electrode arrangements are diametrically opposite. There can be four anchor points between the ring comb electrodes, but less may be used.

This provides a resonant structure that has a shape of a frame that is anchored at four points, for example close to their nodal points. The frame shape is a ring which can either be a circular ring, or a square ring or other polygonal shape ring. To enable actuation with large amplitudes, the resonant structures have comb-drives with interdigitated fingers. The combs are preferably attached close to the anti-nodal points, which are at the mid-point between the anchors.

In the case, of a square, the anchor points are at the corners.

The anchor points can be connected to the substrate by arms which extend either inwardly from the ring or outwardly from the ring. These arms can be considered as connecting beams.

Each ring comb electrode arrangement, and each associated drive or sense comb electrode arrangement, can comprise a first array of parallel comb fingers in a first line and a second connected array of parallel comb fingers in a second line, spaced from the fist line in the direction of the comb fingers.

This arrangement increases the electromechanical coupling, and improves the linearity of the actuation force.

Examples of the invention will now be described with reference to the accompanying drawings, in which.

The invention provides a MEMS resonator in which the resonator mass is in the form of a closed ring anchored at points around the ring. A set of ring comb electrode arrangements is fixed to the ring, for example at locations between the anchor points, to couple the input (drive) and output (sense) signals to/from the resonator mass.

The resonator of the invention has a frame shape in the form of a ring, which can be a circular ring, or a symmetrical polygon shaped ring such as a square. The structure has an in-plane vibration mode shape in which segments of the structure alternatively bend inward and outward, while the width of the structure substantially remains unchanged. Anchors are positioned at the nodal points of the mode shape, i.e. at the boundaries between the segments. At the nodal points (or quasi-nodal points), the material does not significantly move during vibration.

The structure material is a conductive material such as doped single crystal Si, doped poly crystal Si, SiGe, metals, etc. Attached to the anti-nodal points (where the vibration amplitude is greatest) of the segments are combs with interdigitated fingers. The comb-drive structure allows the resonator to vibrate at larger amplitudes and produces more linear force.

Figure 3:
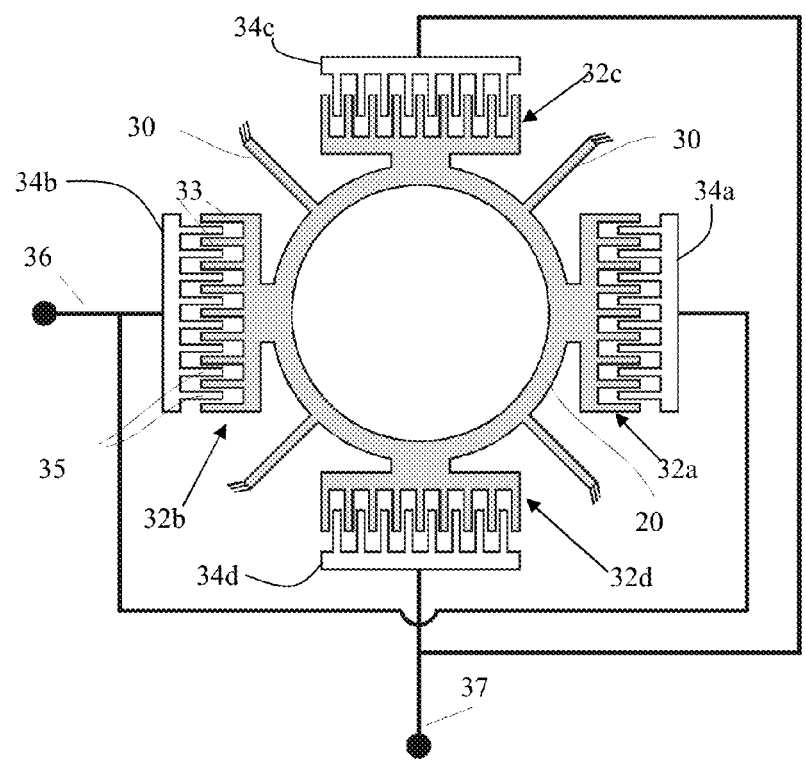
FIG. 3 shows a first resonator design of the invention.

FIG. 3 shows a first example in top view, in which the frame 20 has a shape of a circular ring. The structure is in reality extruded in the third dimension (into the page), and has a certain thickness. The thickness is for instance of a few to a few tens of micrometers.

The diameter of the ring can typically be a few tens up to a few hundred micrometers. The ring is anchored at four points with anchors 30. The anchors connect to the ring 20 at the nodal points.

The anchors are in the form of straight bars in this case, but it should be understood that any other shape of the anchors are allowed, for instance, a T-shape, a Z-shape or a zigzag shape. The anchors can be oriented inwards to the centre of the ring, such as shown in FIG. 4 which is otherwise the same as the design of FIG. 3

Figure 4:
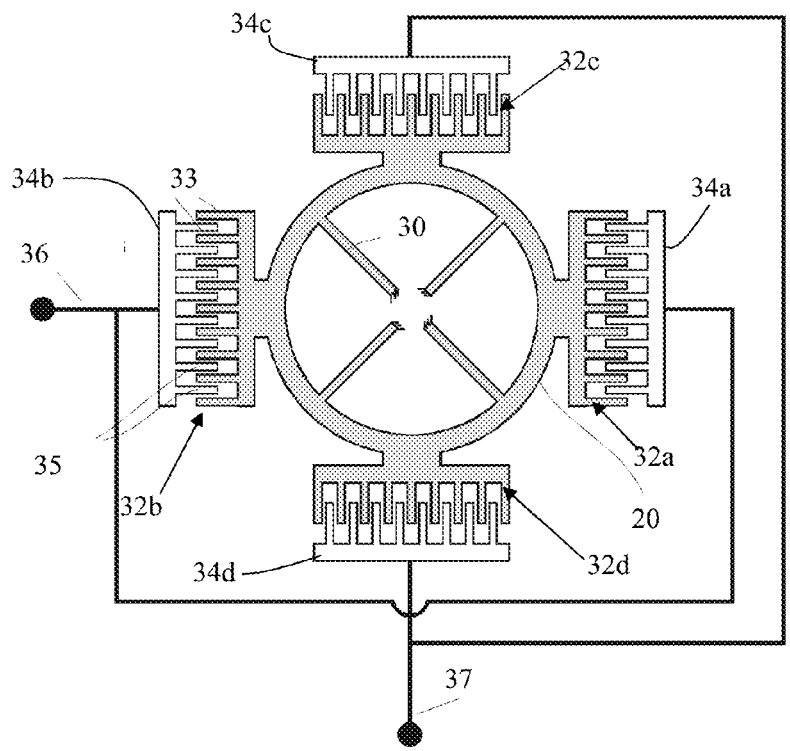
FIG. 4 shows a second resonator design of the invention.

The mechanical loss in the case of FIG. 4 is smaller because the anchors create a balanced stress at the central point.

Figure 5:
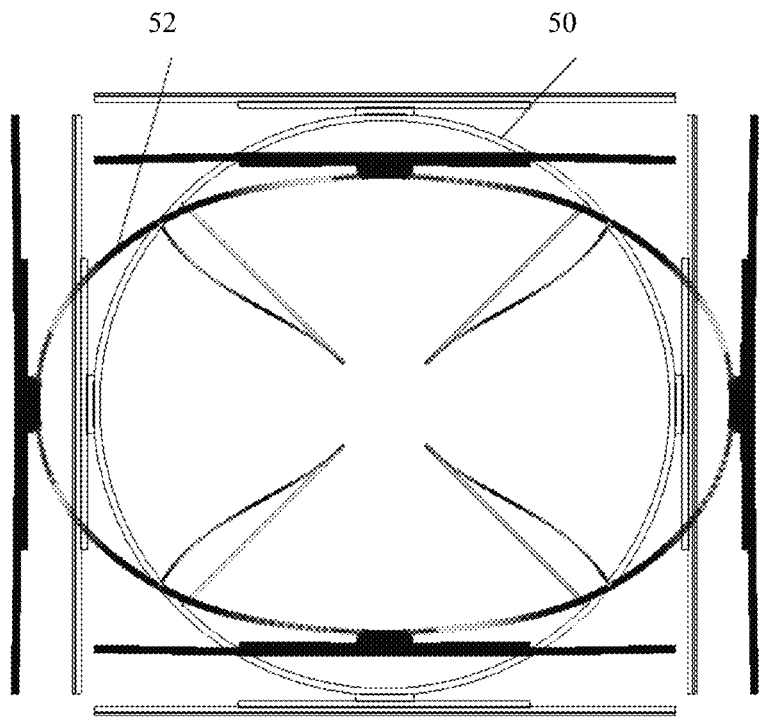
FIG. 5 shows the mode shape for the resonator of FIG. 4.

At the middle of each segment between any two consecutive anchor points, which is the anti-nodal point, an electrode arrangement in the form of a comb 32 is attached (shown as 32a to 32d) with interdigitated fingers 33. The attachment point should not be too large to avoid severe influence on the flexural deformation of the ring, but should be strong enough to support the comb. By attaching to the anti-nodal points, the movement of the ring at that location is linear (as seen in FIG. 5 below).

Opposing each movable comb 32, there is an associated electrode arrangement in the form of a fixed comb 34 (shown as 34a to 34d) with fingers 35 interleaving the movable fingers.

The electrodes are connected in pairs: the left and right fixed electrode arrangements 34a,34b are connected together and the top and bottom fixed electrode arrangements 324c, 34d are connected together. They form the input 36 and output 37 of the resonator. The structure is symmetric so the input and output can be interchanged.

To actuate the resonator, a combination of a DC voltage and an AC voltage is applied to the input electrode 36 (with respect to the potential of the resonator structure). As a result of the actuation, the ring vibrates in an in-plane elliptical mode shape.

FIG. 5 is a finite element simulation of the intended mode shape of the resonator as shown in FIG. 4.

The rest position is shown as 50, and the elliptical mode shape is shown as 52. As can be seen, the anti-nodal points have moved along a linear radial path, and the nodal points where the anchors connect to the structure have hardly moved at all.

To simplify the model, the combs are modelled as a single block, since they do not affect the mode shape. The deformation is exaggerated for ease of viewing.

Because the anchor points are the quasi-nodal points which do not significantly move during vibration, the mechanical loss is reduced. Consequently the Q factor can be very high for this structure. Due to the high linearity of the ring stiffness, the frequency response behaves very linearly up to large vibration amplitudes.

Figure 6:
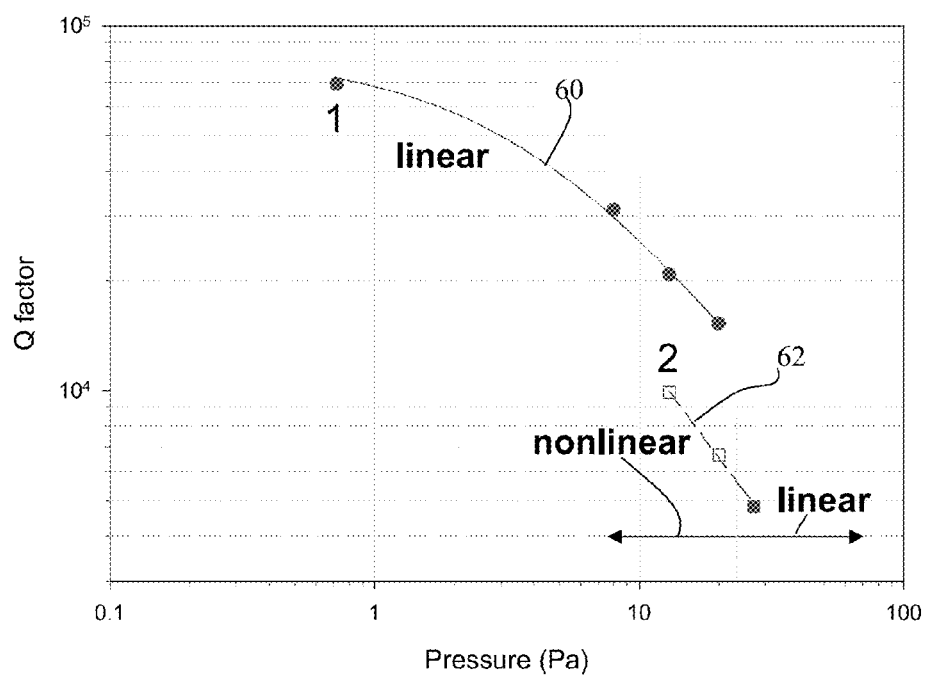
FIG. 6 shows the quality factor as a function of pressure for the resonator of FIG. 4 and for a shuttle type resonator of the type shown in FIG. 1.

FIG. 6 shows the Q factor of the resonator presented as a function of ambient pressure, and shows the behaviour of the resonator made to the design of FIG. 4 with a thickness of 10 µm and a diameter of the ring of 500 µm, as well as a shuttle resonator. The bias voltages of both cases are the same: Vdc=3V and Vac=5 mV.

The Q factor for the resonator of FIG. 4 is shown as plot 60 and the corresponding plot for a shuttle resonator is shown as plot 62.

Figure 1:
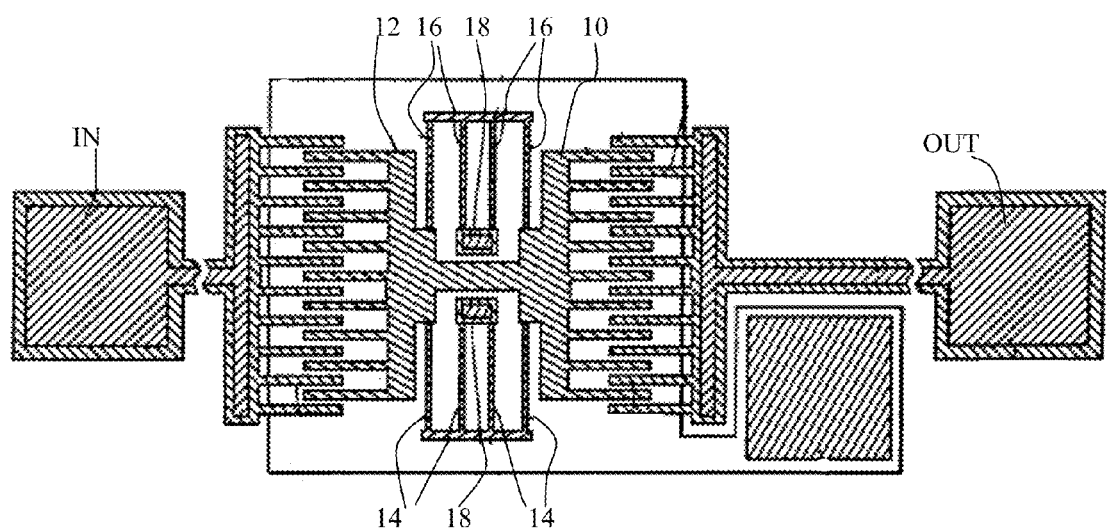
FIG. 1 shows a known MEMS resonator using a shuttle movement between comb electrodes.
Figure 2:
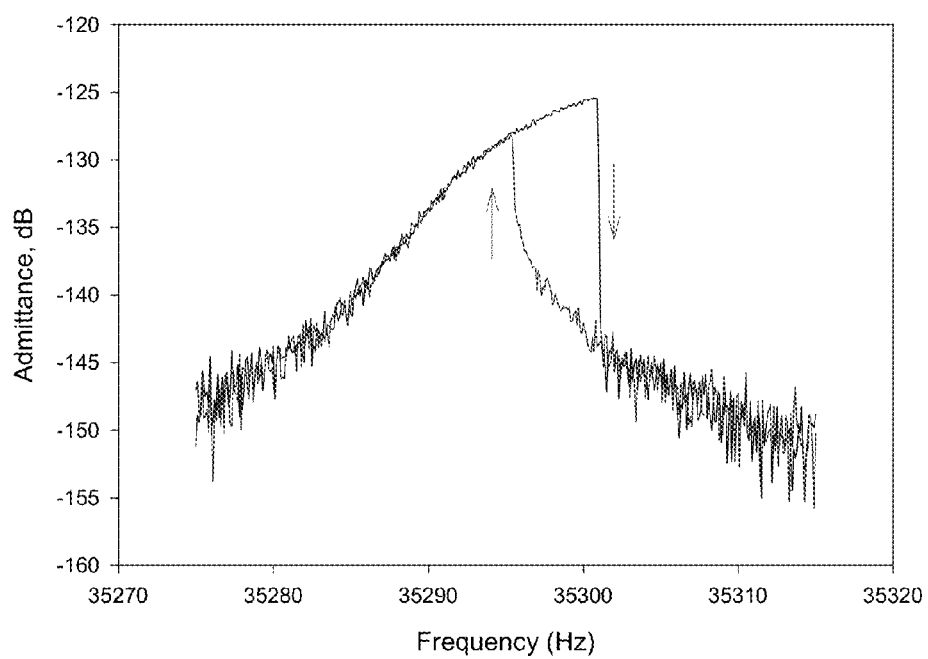
FIG. 2 shows the admittance of the structure of FIG. 1 as a function of frequency.

Pressure has a pronounced effect on the Q factor: the lower the pressure, the lower the air damping loss, thus the higher the Q factor. On the other hand, at higher Q factor, the resonator can vibrate at larger amplitudes, which may lead to nonlinear behaviour, as shown in FIG. 2.

From FIG. 6 it is obvious that the ring resonator by far outperforms the shuttle resonator. At any pressure, the Q factor of the ring is a few times larger than that of the shuttle resonator.

Moreover, the ring resonator always behaves linearly even at the minimum pressure of <1 Pa (where Q~70,000). The operation range for this device is therefore very wide and can be freely selected depending on the available pressure level of the package.

The shuttle resonator is very soon limited by the nonlinearity when pressure is below 20 Pa. Its pressure range for operation is therefore very narrow. The pressure should be higher than 20 Pa in this case to ensure linearity, and it should not be too high to maintain an acceptable Q factor.

Figure 7:
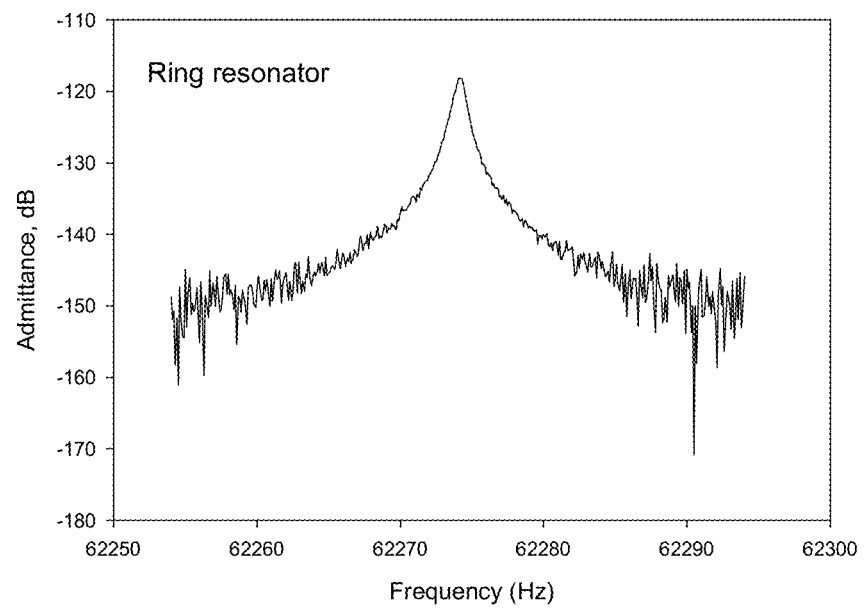
FIG. 7 shows the admittance as a function of frequency for the resonator of FIG. 4.
Figure 8:
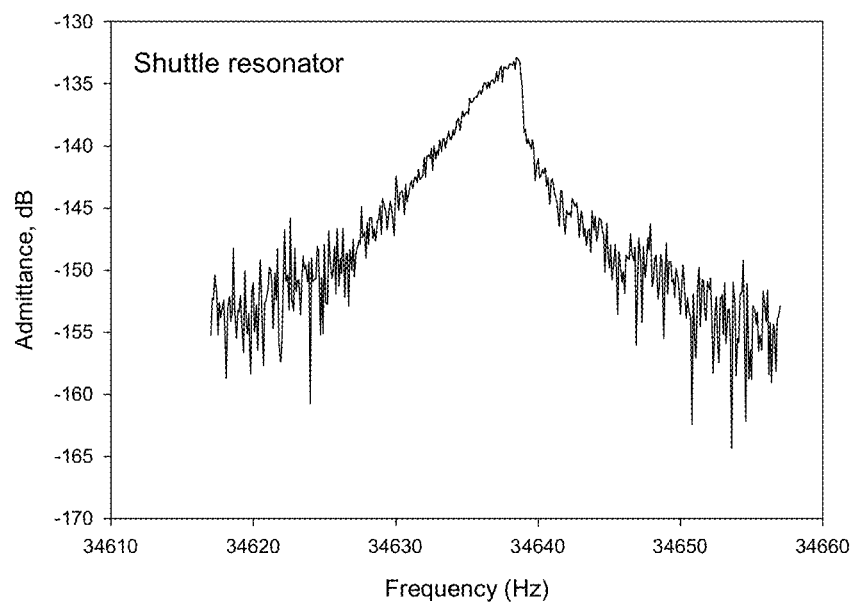
FIG. 8 shows the admittance as a function of frequency for the resonator of FIG. 1.
Figure 9:
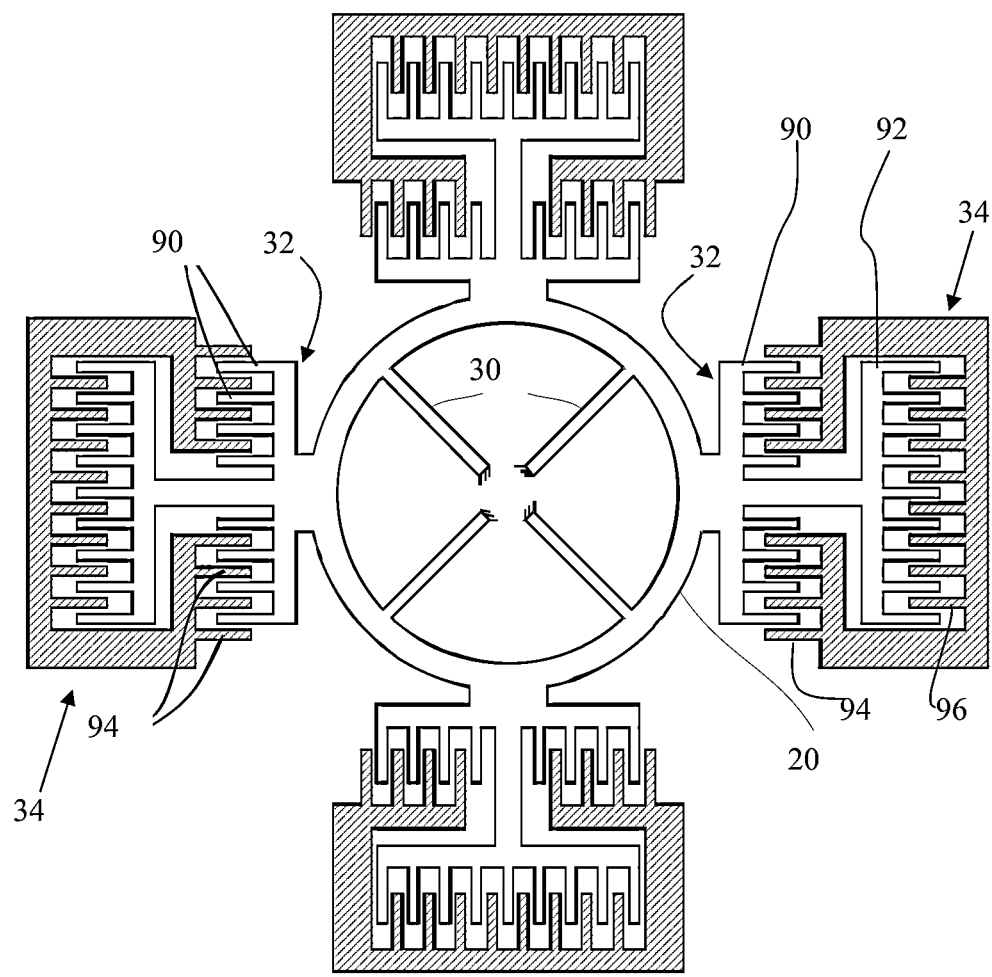
FIG. 9 shows a third resonator design of the invention.

FIGS. 7 and 8 show frequency response curves for the points marked as "1" and "2" in FIG. 6, respectively. Thus, FIG. 7 shows the linear frequency response curve of the ring resonator at point "1" in FIG. 6 and FIG. 9 shows the nonlinear frequency response curve of the shuttle resonator at point "2" in FIG. 6.

At point "1" shown in FIG. 7, the response curve of the ring resonator is perfectly symmetric around the resonance peak, representing a linear response. The Q factor for this curve is about 70,000. As a result of the high Q factor, the motional resistance at this point is only 804 kOhm.

On the other hand, at point "2" shown in FIG. 8, the curve is clearly nonlinear with a jump near the resonance peak. The motional resistance at this point is much higher at around 4.4 MOhm.

To increase the electromechanical coupling and hence reduce the motional resistance of the resonator, the number of fingers should be increased. In the examples above, there are anchor arms at each quasi-nodal point. However, less anchor arms may be used. For example, with reference to FIG. 3, there may be only two of the anchor arms—either an adjacent pair or an opposite pair. The number of anchors should be enough to support the whole structure of the ring and combs. At the limit, one anchor arm may suffice.

In another embodiment, as shown in FIG. 9, the comb-drives can be arranged in a plurality of stages. In this example, each comb 32 has two stages, but it should be understood that the number of stages can be larger if this does not give rise to undesired out-of-plane vibration, or does not overload the anchors.

Each stage comprises a set of comb fingers. Each movable electrode arrangement has a first set of fingers 90 and a second set of fingers 92. All comb fingers are parallel, and one set is spaced (along the finger direction) from the other set. As shown, a central bar connects the two sets of comb fingers. The fixed electrode arrangements 34 corresponds, with a set of first fingers 94 and a set of second fingers 96.

Figure 10:
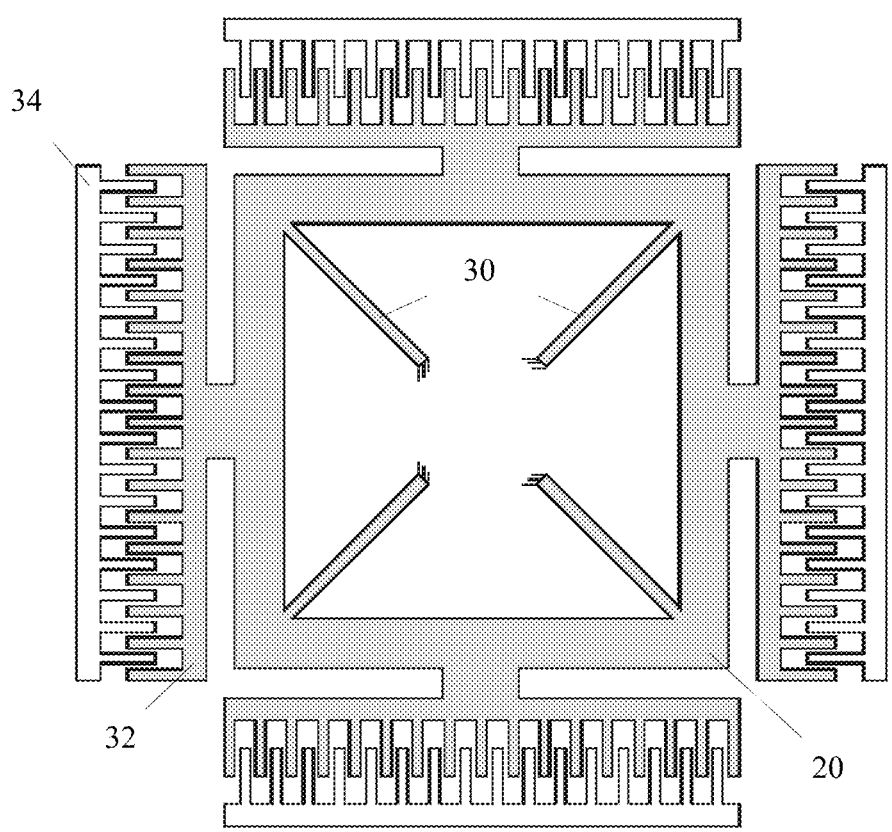
FIG. 10 shows a fourth resonator design of the invention.

In another embodiment, the frame structure of the resonator can be a square as shown in FIG. 10. The structure has an in-plane vibration mode shape in which segments of the frame alternatively bend inward and outward, while the width of the frame substantially remains unchanged.

The anchors 30 are positioned at the quasi-nodal points of the mode shape, which in this case is at the corners of the frame 20. The anchor can be a straight bar, as in this example, or can be any suitable shape, such as T-shape, Z-shape, zigzag shape, etc.

The anchors can again point outwards or inwards. Similar to the case for the circular ring, there are combs attached to the sides of the frame. The comb structure can have single or multiple stages as explained above. The frame can also be rounded off at its corners to have better distributed stress.

The invention provides a design in which instead of a shuttle body that swings sideway and makes large asymmetric stress on the anchors, a frame-shaped resonator body (in the form of either a ring or a polygonal frame) vibrates in a flexural mode shape.

The vibration mode shape is therefore symmetric with respect to the anchors, resulting in much lower mechanical loss. The linearity of the frame is also much better than the folded clamped-clamped beams of the shuttle resonators.

The invention gives a lower mechanical loss, and a higher Q factor. It also enables a more linear spring, which allows the resonator to behave linearly even at very low air pressure.

The electrical circuit used to control the resonator is not changed by the arrangement of the invention. Thus, the electrical signal output signal at port 37 in FIG. 3 is fed into an amplifier circuit comprising a gain amplifier and a phase shifter. The output of the amplifier is fed back into the actuation side of the resonator to port 36. The output frequency of the oscillator circuit is kept stable by the MEMS resonant frequency.

To sense the capacitance change and thereby derive an oscillator signal, a DC voltage is applied between the structure and the sensing electrode connected to the output 37. The capacitance change manifests itself in the AC current that flows through the sensing gap, which is called the motional current.

The use of the resonator design of the invention in an oscillator circuit will be routine to those skilled in the art.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A MEMS resonator comprising:
a resonator mass in a form of a closed ring;
a set of anchor points spaced around the ring, where the ring is connected to a fixed substrate at the anchor points by arms that extend inwardly or outwardly from the ring, wherein each of the anchor points comprises a quasi-nodal point of a minimum movement of the ring during a resonant deformation of the ring;
a set of ring comb electrode arrangements fixed to the ring at anti-nodal points of the ring where a vibration amplitude is greatest during the resonant deformation of the ring;
at least one drive comb electrode arrangement attached to the substrate and which interfaces with one of the set of comb electrode arrangements fixed to the ring;
at least one sense comb electrode arrangement attached to the substrate and which interfaces with another one of the set of comb electrode arrangements fixed to the ring; and
a control circuit using feedback from the sense comb electrode for controlling signals applied to the at least one drive comb electrode arrangement such that the resonator mass vibrates as a resonator in response to the signals, wherein the resonator mass, the set of ring comb electrode arrangements, the at least one drive comb electrode arrangement and at least one sense comb electrode arrangement is symmetric around the anchor points, wherein the closed ring has a rest position shape and a deformed shape, and wherein the control circuit uses the feedback to cause the resonator mass to resonantly vibrate between the rest position shape and the deformed shape in response to the signals.

2. A resonator as claimed in claim 1, further comprising a set of exactly four ring comb electrode arrangements, exactly two drive comb electrode arrangements and exactly two sense comb electrode arrangements.

3. A resonator as claimed in claim 2, wherein the four ring comb electrode arrangements are evenly angularly spaced around the ring, the two drive comb electrode arrangements are diametrically opposite, and the two sense comb electrode arrangements are diametrically opposite.

4. A resonator as claimed in claim 1, wherein the ring comprises a circle.

5. A resonator as claimed in claim 1, wherein the ring comprises a square having a plurality of corners, and the anchor points are at at least one of the corners.

6. A resonator as claimed in claim 1, wherein the anchor points are connected to the substrate by arms which extend inwardly from the ring.

7. A resonator as claimed in claim 1, wherein the anchor points are connected to the substrate by arms which extend outwardly from the ring.

8. A resonator as claimed in claim 1, wherein each ring comb electrode arrangement, and each associated drive or sense comb electrode arrangement, comprise a first array of parallel comb fingers in a first line and a second connected array of parallel comb fingers in a second line, spaced from the first line in a direction of the comb fingers.

9. A resonator as claimed in claim 1, wherein each ring comb electrode arrangement is attached to the ring at a midpoint between nodal points of minimum movement of the ring during resonant deformation of the ring.

10. A resonator as claimed in claim 1, further comprising exactly four anchor points.

11. The resonator of claim 1, wherein the control circuit is configured to actuate the resonator mass using a combination of a DC voltage and an AC voltage.

* * * * *